US007771547B2

(12) United States Patent
Bieler et al.

(10) Patent No.: US 7,771,547 B2
(45) Date of Patent: Aug. 10, 2010

(54) METHODS FOR PRODUCING LEAD-FREE IN-SITU COMPOSITE SOLDER ALLOYS

(75) Inventors: Thomas R. Bieler, Lansing, MI (US); Karatholuvu N. Subramanian, Brighton, MI (US); Sunglak Choi, Lansing, MI (US)

(73) Assignee: Board of Trustees Operating Michigan State University, East Lansing, MI (US)

( * ) Notice: Subject to any disclaimer, the term of this patent is extended or adjusted under 35 U.S.C. 154(b) by 1293 days.

(21) Appl. No.: 10/730,398

(22) Filed: Dec. 8, 2003

(65) Prior Publication Data

US 2004/0112478 A1    Jun. 17, 2004

Related U.S. Application Data

(63) Continuation of application No. 09/114,665, filed on Jul. 13, 1998, now abandoned.

(51) Int. Cl.
*B22D 17/00* (2006.01)
*B23K 35/34* (2006.01)

(52) U.S. Cl. ...................... 148/538; 228/198
(58) Field of Classification Search ................. 148/538; 228/198
See application file for complete search history.

(56) References Cited

U.S. PATENT DOCUMENTS

| 3,481,795 A | 12/1969 | Lane |
| 4,248,905 A | 2/1981 | Harvey |
| 4,358,884 A | 11/1982 | Harvey et al. |
| 4,506,822 A | 3/1985 | Hammersand et al. |
| 5,066,544 A | 11/1991 | Betrabet et al. |
| 5,094,700 A | 3/1992 | Sekhar |
| 5,344,607 A | 9/1994 | Gonya et al. |
| 5,429,689 A | 7/1995 | Shangguan et al. |
| 5,520,752 A * | 5/1996 | Lucey et al. ............... 148/400 |
| 5,527,628 A | 6/1996 | Anderson et al. |

OTHER PUBLICATIONS

Anderson, et al., "Microstructural Modifications and Properties of Sn-Ag-Cu Solder Joints Induced by Alloying", Journal of Electronic Materials, vol. 31, No. 11, pp. 1166-1174 (2002).
Attarwala, A.I. et al., "Confirmation of Creep and Fatigue Damage in Pb/Sn Solder Joints," J. Electron. Packag. 114:109-111 (1992).
Betrabet, H.S. et al., "Processing Dispersion-Strengthened Sn-Pb Solders to Achieve Microstructural Refinement and Stability," Script Metall. 25:2323-2328 (1991).
Betrabet, H.S. et al., "Towards Increased Fatigue Resistance in Sn-Pb Solders by Dispersion Strengthening," Proc. Conf. NEPCON., West Anaheim, CA, pp. 1276-1277 (1992).

(Continued)

*Primary Examiner*—Sikyin Ip
(74) *Attorney, Agent, or Firm*—Harness, Dickey & Pierce, P.L.C.

(57) ABSTRACT

Methods are disclosed for producing in-situ composite solders having a particulate intermetallic phase homogeneously distributed throughout the solder matrix. An eutectic solder is mixed with the components of the intermetallic phase, melted and rapidly cooled to form the desired solder. In-situ composite solder alloys formed by the disclosed method provide greater solder joint strength and fatigue resistance.

43 Claims, 5 Drawing Sheets

OTHER PUBLICATIONS

Clough, R.B. et al., "Preparation and Properties of Reflowed Paste and Bulk Composite Solder," Proc. Conf. NEPCON., West Anaheim, CA, pp. 1256-1265 (1992).

Frear, D.R. et al., "Thermal Fatigue in Solder Joints," JOM, pp. 18-22 (Jun. 1988).

Gibson, A.W. et al., "Issues Regarding Microstructural Coarsening Due to Aging of Eutectic Tin-Silver Solder," Des. Reliab. Solders Solder Interconnect., Proc. Symp. (1997), 97-103.

Ho, C.T. et al., "Carbon fiber reinforced tin-lead alloy as a low thermal expansion solder preform," *J. Mater. Res.* 5(6):1266-1270 (1990).

Jin, S., "Solder Materials Issues in High-Density Interconnection and Packaging," *Final Program ASM-TMS Materials Week '96*, ASM International and The Minerals, Metals & Materials Society, Cincinnati, Ohio, pp. 116 (1996).

Kuo, C.G. et al., "Fatigue Deformation of In-Situ Composite Solders," 1st Int'l. Conf. Microstructures and Mechanical Properties of Aging Materials, ed. P.K. Liaw, R. Viswanathm, K.L. Murty, E.P. Simonen and D.R. Frear, The Minerals Metals & Materials Society, TMS, Warrendale, PA, pp. 417-423 (1993).

Kuo, C.G. et al., "Tensile and Creep Properties of In-Situ Composite Solders," 1st Int'l Conf. Microstructures and Mechanical Properties of Aging Materials, ed. P.K. Liaw, R. Viswanathm, K.L. Murty, E.P. Simonen and D.R. Frear, The Minerals Metals & Materials Society, TMS, Warrendale, PA, pp. 409-415 (1993).

Lau, J.H. et al., "Solder Joint Fatigue in Surface Mount Technology: State of the Art," Solid State Tech. pp. 91-104 (1985).

Lewis, R. (Ed.), Hawley's Condensed Chemical Dictionary, Thirteenth Ed., p. 483.

Marshall, J.L. et al., "Composite Solders," IEEE Trans. Comp. Hybrids Manuf. Tech. 14(4):698-702 (1991).

Marshall, J.L. et al., "Microcharacterization of Composite Solders," Proc. Conf. NEPCON., West Anaheim, CA, pp. 1278-1283 (1992).

McCormack, M. et al., "Enhanced Solder Alloy Performance by Magnetic Dispersions," IEEE Trans. Comp. Hybrids Manuf. Tech.-Part A 17(3):452-457 (1994).

McCormack, M. et al., "The Design and Properties of New, Pb-Free Solder Alloys," Proc. IEEE/CPMT Int'l Electronics Manufacturing Technology Symp. pp. 7-14 (1994).

Miller, et al., "A Viable Tin-Lead Solder Substitute: Sn-Ag-Cu", Journal of Electronic Materials, vol. 23, No. 7, pp. 595-601 (1994).

Moon, et al., "Experimental and Thermodynamic Assessment of Sn-Ag-Cu Solder Alloys", Journal of Electronic Materials, vol. 29, No. 10, pp. 1122-1136 (2000).

Pinizzotto, R.F. et al., "Microstructural Development in Composite Solders Caused by Long Time, High Temperature Annealing," Proc. Conf. NEPCON., West Anaheim, CA, pp. 1284-1298 (1992).

Sastry, S.M.L., et al., "Microstructures and Mechanical Properties of In-Situ Composite Solders," Proc. Conf. NEPCON, West Anaheim, CA, pp. 1266-1275 (1992).

Shangguan, D. et al., "Evaluation of Lead-Free Eutectic Sn-Ag Solder for Automotive Electronics Packaging Applications," Proc. IEEE/CPMT Int'l Electronics Manufacturing Technology Symp., pp. 25-37 (1994).

Shine, M.C. et al., "Fatigue of Solder Joints in Surface Mount Devices," ASTM STP 942:588-610 (1988).

Smithells Metals Reference Book, 7th ed., Butterworth Heinemann, Oxford; 1992, p. 11-242, "Adapted Sn-Ag-Cu Phase Diagram".

Tien, J.K. et al., "Creep-Fatigue Interactions in Solders," IEEE Trans. Comp. Hybrids Manuf. Tech. 12(4):502-505 (1989).

Wasynczuk, J.A. et al., "Shear Creep of $Cu_6Sn_5$/Sn-Pb Eutectic Composites," Proc. Conf. NEPCON., West Anaheim, CA, pp. 1245-1255 (1992).

Weinbel, R.C. et al., "Creep-fatigue interaction in eutectic lead-tin solder alloy," J. Mater. Sci. 22:3901-3906 (1987).

* cited by examiner

METHODS FOR PRODUCING LEAD-FREE IN-SITU COMPOSITE SOLDER ALLOYS

This application is a continuation of prior application Ser. No. 09/114,665, filed Jul. 13, 1998, now abandoned.

FIELD OF THE INVENTION

This invention generally relates to methods for improving the mechanical properties of solder and more specifically, to methods for producing a composite lead-free solder having an uniformly distributed intermetallic phase.

BACKGROUND OF THE INVENTION

The most common solder materials are tin/lead solders. These solders have been used to join metals for at least a millennium, and they have been the best material for the interconnection of modern electronic components and packages during the past several decades. The prevalent use of tin/lead solders is due mainly to their low cost and unique combination of material properties. McCormack, M. et al., *Proc. IEEE/CPMT Int'l Electronics Manufacturing Technology Symp.* pp. 7-14 (1994).

However in light of recent environmental and health concerns, there have been increasing research efforts to develop lead-free solders to replace the tin/lead solders. Shangguan, D. et al., *Proc. IEEE/CPMT Int'l Electronics Manufacturing Technology Symp.*, pp. 25-37 (1994). Lead and lead-bearing compounds are among the most toxic substances, and the environmental and health issues concerning the toxicity of lead threaten to ban the use of lead-bearing solders in electronic applications. These concerns have inspired a great deal of research effort in the development of suitable lead-free solder alloys.

The potential candidates of lead-free solders which have been investigated are eutectic Sn/Bi, eutectic Sn/Ag, eutectic Sn/Zn, and eutectic Sn/In. Even though some lead-free solders have been in use in special applications for several years, there is no suitable substitute for tin/lead solder alloys at present.

Miniaturization in the microelectronics industry and the widespread use of surface mount technology (SMT) which was introduced in the 1960's, have also demanded higher performance of solders. Solders have to provide a structural function by mechanically supporting the electronic devices in addition to playing a role as the electronic contacts between printed circuit substrates and surface mount devices. Lau, J. H. et al., *Solid State Tech.* pp. 91-104 (1985). The mechanical properties of solders have also become more important because of the small size of solder joints in high density surface mount device packages. The development of alternative lead-free solders with superior mechanical properties to tin/lead solder leading to improved reliability of solder joints, is thus desirable.

The service temperature for solders are generally high relative to their absolute melting point and solder microstructures tend to be highly unstable under typical operating conditions. Solder materials are also readily subject to thermal stresses induced by the thermal expansion mismatch between components and substrates during thermal cycling. Consequently, the development of alternative solder materials possessing stable microstructure and improved mechanical strength to ensure reliability of solder joints is also desirable.

Approaches to strengthen the conventional solder materials by introducing fine second phase particles to solder to create a composite have been under investigation. Marshall, J. L. et al., *Proc. Conf. NEPCON.*, West Anaheim, Calif., pp. 1278-1283 (1992); Betrabet, H. S. et al., *Script Metall.* 25:2323-2328 (1991); Sastry, S. M. L., et al., *Proc. Conf. NEPCON*, West Anaheim, Calif., pp. 1266-1275 (1992); Clough, R. B. et al., *Proc. Conf. NEPCON.*, West Anaheim, Calif., pp. 1256-1265 (1992); Pinizzotto, R. F. et al., *Proc. Conf. NEPCON.*, West Anaheim, Calif., pp. 1284-1298 (1992); Betrabet, H. S. et al., *Proc. Conf. NEPCON.*, West Anaheim, Calif., pp. 1276-1277 (1992); Kuo, C. G. et al., *1st Int'l. Conf. Microstructures and Mechanical Properties of Aging Materials*, ed. P. K. Liaw, R. Viswanathm, K. L. Murty, E. P. Simonen and D. R. Frear, The Minerals Metals & Materials Society, TMS, Warrendale, Pa., pp. 417-423 (1993); Kuo, C. G. et al., *1st Int'l. Conf. Microstructures and Mechanical Properties of Aging Materials*, ed. P. K. Liaw, R. Viswanathm, K. L. Murty, E. P. Simonen and D. R. Frear, The Minerals Metals & Materials Society, TMS, Warrendale, Pa., pp. 409-415 (1993). Such particles may be introduced either by precipitation from supersaturated solids or liquid solution or by external addition of foreign particles as dispersoids. The precipitation strengthening may not be a suitable method because the precipitates are generally prone to coarsening unless one or more of the constituent elements in the precipitate phase are chosen to have low solubility and diffusivity in the solder matrix. On the other hand, foreign dispersoid particles introduced within solder alloys would not coarsen easily since the elements or compounds involved can be chosen to have low solubilities and diffusivities or no reactivity with the matrix solder alloy. McCormack, M. et al., *IEEE Trans. Comp. Hybrids Manuf. Tech.—Part A* 17(3):452-457 (1994). Mechanical methods such as vigorous shearing while the composite solder is in a semi-solid phase have also been used to produce intermetallic phases with small homogeneous particles (U.S. Pat. No. 5,094,700).

Several types of particles have been used to produce composite solder with stable microstructure and improved mechanical properties. The representative particles used are the powder of intermetallic compounds ($Cu_6Sn_5$, $Cu_3Sn$), elemental metals such as Cu, Ni, Ag, Au to introduce intermetallic compounds with Sn in the solder matrix, aluminum oxide (Jin, S., *Final Program ASM-TMS Materials Week '96*, ASM International and The Minerals, Metals & Materials Society, Cincinnati, Ohio, pp. 116 (1996)), and carbon fiber.

The intermetallic phase dispersoids should be small enough and closely spaced to yield significant strengthening without considerable loss in ductility. It is also important to uniformly distribute small dispersoid particles in sufficient quantity and maintain this dispersion after the alloy is melted and reflowed to positively affect mechanical properties of the solid solder. A magnetic field was applied to molten solders containing fine Fe particles to overcome the gravity-induced particle segregation problem and to achieve a microstructure with a uniformly distributed three-dimensional network of the dispersoid particles. McCormack, M. et al., *IEEE Trans. Comp. Hybrids Manuf. Tech.—Part A* 17(3):452-457 (1994).

The dispersoids should make composite solder more resistant to creep-fatigue deformations by acting as heterogeneous nucleation sites to produce a very fine, initial microstructure of solder matrix upon reflow, and by serving as obstacles to grain growth, crack growth, and microstructural coarsening to retain the stable microstructure of solder even after thermal exposure. Betrabet, H. S. et al., *Script Metall.* 25:2323-2328 (1991); Wasynczuk, J. A. et al., *Proc. Conf. NEPCON.*, West Anaheim, Calif., pp. 1245-1255 (1992); Marshall, J. L. et al., *IEEE Trans. Comp. Hybrids Manuf. Tech.* 14(4):698-702 (1991).

There is also a need for a solder with a low coefficient of thermal expansion, since the stresses are thermally induced in solder joints due to the difference in thermal expansion coefficient between substrate and solder. Carbon fiber with nearly zero thermal expansion coefficient as a dispersoid was developed to adjust the thermal expansion coefficient of solder. Composite solders with the amount of carbon fiber which makes thermal expansion coefficient of solder to be similar to that of substrate, exhibited prolonged fatigue lives. Ho, C. T. et al., *J. Mater. Res.* 5(6):1266-1270 (1990).

Solder joints in electronic modules undergo temperature cycling which is caused by power on/off cycles, daily temperature variations, and seasonal changes. Solder joints are subject to a cyclic loading condition imposed by thermal stresses induced by the difference between the thermal expansion of electronic components. Since the thermal cycling ordinarily exhibits a low strain-rate, solder joints basically undergo low frequency thermal fatigue. The service temperature of solder joints corresponding to high homologous temperature and relatively long hold times are often encountered during service conditions. Thus time-dependent, thermally-activated deformation or creep becomes significant at high homologous temperature. Thermal aging and cycling lead to heterogeneous coarsening that accelerates the nucleation of cracks. Frear, D. R. et al., *JOM*, pgs. 18-22 (June, 1988). Consequently, damage or failure of solder joints is caused by creep-fatigue interaction which typically describes the cyclic application of a load at temperatures where time dependent, thermally-activated processes are significant.

The creep-fatigue damage in solder joints has been identified in the analysis of fracture surface of solder joints which were thermally cycled, where fatigue striations were observed side by side with creep voids and extensive intergranular cracking. Attarwala, A. I. et al., *J. Electron. Packag.* 114:109-111 (1992). The eutectic tin/lead solder subjected to isothermal cyclic loading at room temperature showed that deformation occurred primarily by creep process and was very sensitive to hold time or frequency resulting in increasing creep rate and decreasing cycles to failure with increasing hold time. Weinbel, R. C. et al., *J. Mater. Sci.* 22:3901-3906 (1987); Tien, J. K. et al., *IEEE Trans. Comp. Hybrids Manuf. Tech.* 12(4):502-505 (1989). Creep was also observed to be the predominant mode of deformation for isothermal fatigue in which good correlation was found between the isothermal fatigue life of solder joints and the amount of creep strain per cycle. Shine, M. C. et al., *ASTM STP* 942:588-610 (1988).

In summary, the reliability concerns of solder joints in addition to the environmental concerns in the use of toxic materials, place greater demands on the performance of solder joints especially in electronic applications. It would thus be desirable to provide an improved solder which meets these demands. It would also be desirable to provide an improved solder which is lead-free. It would further be desirable to provide lead-free composite solders incorporating particulate reinforcement that enhances the solder's resistance to thermal fatigue damage. It would also be desirable to provide a method for producing lead-free, in-situ composite solders which yield solder joints with improved reliability, especially in electrical systems. It would yet further be desirable to provide a composite lead-free, in-situ solder having a microstructure such that a solder joint employing the solder would have improved resistance to creep and thermal fatigue damage.

SUMMARY OF THE INVENTION

The present invention provides methods for producing a lead-free, in-situ composite solder comprising an eutectic lead-free solder and a homogeneous intermetallic phase. The methods of the instant invention produce a composite solder comprising an intermetallic phase that is uniformly distributed throughout the solder having a particulate size of preferably less than or equal to about 10 microns. The resulting composite solder produces solder joints with increased strength, lower creep rates, and enhanced ductility as compared to known lead-free solders. While not wishing to be bound by theory, it is believed that the improved mechanical behavior and properties of the solders of the present invention result from fine and equiaxed microstructure and uniform distribution of intermetallic particles which can be obtained from a fast cooling rate during solidification.

The solder formed by the methods of the present invention can be provided in many forms as needed for particular solder applications. For example, the solder can be provided as solder wire, solder sheet, solder ingot and solder powder. The solder formed by the methods described herein can thus be used in numerous applications as a replacement for lead-containing solder, e.g., in solder reflow and other soldering processes widely used in the electronic industry.

Additional objects, advantages, and features of the present invention will become apparent from the following description and appended claims, taken in conjunction with the accompanying drawings.

BRIEF DESCRIPTION OF THE DRAWINGS

The various advantages of the present invention will become apparent to one skilled in the art by reading the following specification and subjoined claims and by referencing the following drawings in which:

DETAILED DESCRIPTION OF THE PREFERRED EMBODIMENTS

Figure 1A:
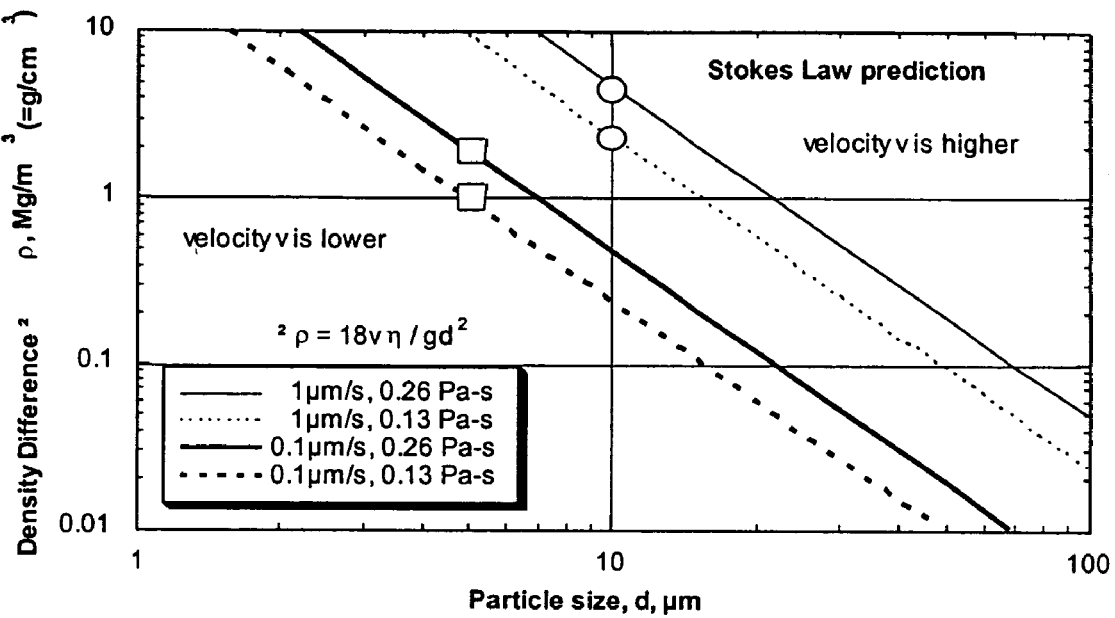
FIGS. 1A-1B are graphs illustrating the predicted values for intermetallic particle size and velocity as determined by Stokes law.

Methods for producing lead-free, in-situ composite solders with intermetallic particulate reinforcements are provided. In one embodiment, a method of the present invention comprises the steps of identifying a solder that will be the matrix of the composite solder, providing a class of intermetallic compound for the strengthening phase and mixing the solder and the elements that will form the intermetallic compound in the desired ratio. The method further comprises heating the mixture until all of the individual components are melted (non-solid) and then rapidly cooling the mixture by quickly reducing the temperature (e.g., by splat quenching or a similar method), thereby solidifying the mixture. In an alternative embodiment, after heating the mixture, the mixture is cooled until it is in solid form and reheated to a temperature slightly above the melting temperature of the intermetallic compound, and then rapidly cooled. The resulting solder has very fine precipitates of the intermetallic phase. In one embodiment, the particulate size is less than or equal to about 10 microns. In another embodiment, the particulate size is less than about 2 microns.

It is appreciated that fracture initiation in solder joints results from excessive straining in locations commonly found in three regions: i) at undesirable intermetallic particles that form within solder joints in an inhomogeneous manner due to the melt-solidification process during soldering, ii) at the interface layer between the solder and the substrate where these same intermetallic particles form as a continuous interlayer, or iii) at regions of microstructure where thermal cycling and stress have caused a change in scale or dimension of microstructure features. Microstructural damage that leads to crack nucleation is caused by these regions which deform differently from the rest of the solder.

The methods of the present invention provide solder compositions comprising intermetallic particles found homogeneously throughout the solder. The homogeneously placed intermetallic particles therefore do not act as local stress concentrators that cause aberrations in the microstructure. While not wishing to be bound by theory, it is believed that the benefits of the resulting solder include, but are not limited to, i) a reduction in the thermal expansion coefficient, which is a driving force for damage accumulated due to thermal cycling, ii) a strengthening of the solder joint causing less overall deformation, and hence, reduce creep and fatigue damage under service conditions, iii) limited recrystallization and growth of large grains, since grain boundary motion is inhibited or arrested by the particles, and iv) the preclusion of strains being concentrated in one location of the joint.

A composite solder of the present invention is formed by introducing an intermetallic phase to a lead-free solder. For example, Cu and Sn may be added to Sn/Ag solder (96.5 Sn/3.5 Ag) to produce an intermetallic phase of $Cu_6Sn_5$. The mixture is heated to a temperature greater than the highest melting point of the constituent materials such that all components exist as liquids. After heating for a sufficient time to ensure melting of all components, the molten solder is allowed to cool and solidify. The composite material is then reheated to a temperature greater than the melting point of the intermetallic phase and cooled rapidly to form a fine, homogeneous intermetallic dispersion with a particulate size less than or equal to about 10 microns. The rate of cooling is indirectly proportional to the resulting particle size of the intermetallic phase and therefore the more rapid the molten mixture is cooled, the smaller the particle size of the intermetallic phase. Rapid cooling can be achieved by splat quenching on copper plates, spray atomization, continuous casting into solid form, rapid solidification melt spinning or other rapid solidification processes known to those skilled in the art. By "rapid cooling" or "rapidly cooling" is meant cooling at a rate greater than or equal to about 100° C./sec.

In one embodiment a lead-free eutectic solder is used, e.g., a lead-free binary or ternary eutectic solder. However, any conventional solder including commercially available solders may be employed. Examples of suitable binary eutectic solders include, but are not limited to, Sn/Ag, Sn/Sb, Sn/In, Sn/Zn and Sn/Bi. Suitable ternary eutectic solders include, but are not limited to, Sn/Pb/Ag, Sn/Bi/Sb, Sn/Ag/Cu (U.S. Pat. No. 5,527,628) and Sn/Bi/In (U.S. Pat. No. 5,344,607). It will be appreciated that binary and ternary near-eutectic solders can also be used with the present invention. By "near-eutectic solder" is meant a solder in which the composition of the minority element varies up to about 20% from that of the eutectic solder. It will be appreciated that the choice of solder is chosen based on it's technical suitability as a soldering material.

In the methods of the present invention, the elements that will form an intermetallic compound as the strengthening phase are combined with the lead-free binary or ternary solder. Examples of low cost and convenient elements include the transition metals between Ti and Zn. Preferably, the intermetallic compound contains at least one element present in the solder and has a density that is similar to the eutectic solder. More preferably, the density of the intermetallic compound will be within about 10% of the eutectic solder. If the difference in density between the intermetallic compound and the eutectic solder is too great, the resulting reflow of the solder will be impacted resulting in a non-homogenous distribution of the intermetallic phase.

The desired density of the intermetallic phase can be determined by Stokes Law. The intermetallic phase should have a density such that the velocity of the particles of the intermetallic phase during remelt will not significantly impact the homogenous distribution of particles.

The upward velocity (v) driven by buoyancy of a spherical second phase (i.e., intermetallic phase) in molten solder can be predicted by Stokes Law:

$$v = g\,\Delta\rho\,d^2/18\eta$$

where v is the velocity of the spherical phase, g=9.8 m/s² (the gravitational constant), $\Delta\rho=\rho-\rho_o$ (Mg/m³) (the difference between the density of the solder($\rho$) and the other phase($\rho_o$)), d (μm) is the diameter, and η (Pa-s) is the dynamic viscosity of the molten solder. The above equation can be applied in choosing the reinforcing intermetallic particles used in the methods of the present invention wherein v is the velocity of a reinforcing intermetallic particle, $\Delta\rho=\rho-\rho_o$ describes the difference between the density of the solder and the particle, and d is the particle diameter. Rearranging the above equation results in:

$$\Delta\rho = 18\,v\,\eta/g\,d^2$$

Figure 1B:
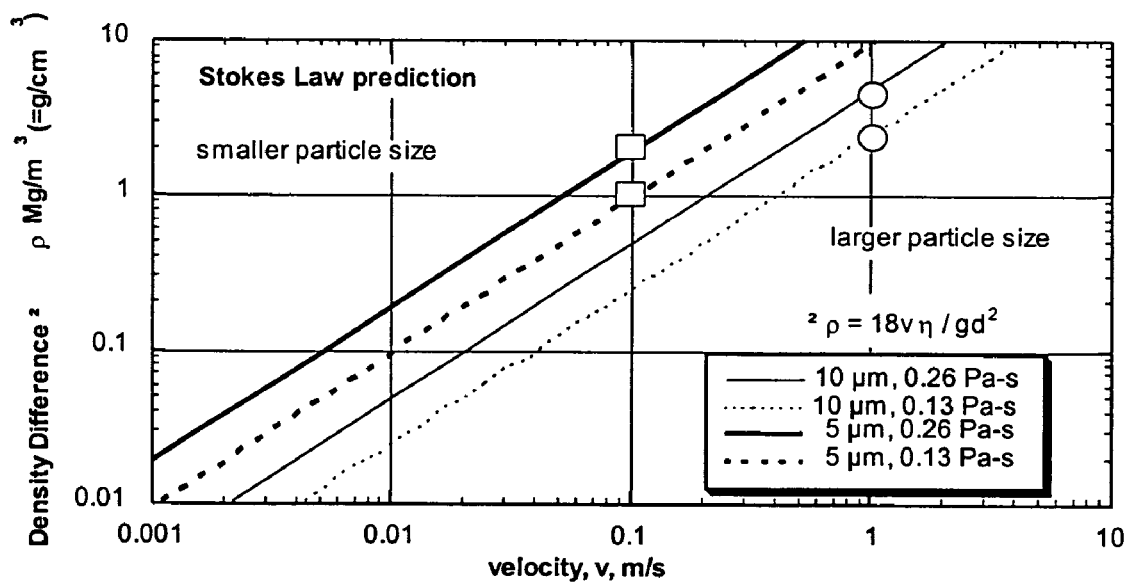

Plots of both equations are shown in FIGS. 1A and 1B using approximate values for some parameters described in greater detail below. The circles and the boxes represent the same condition in the two plots. An average solder joint thickness can be used as a meaningful distance, and 30 seconds as a meaningful time that the joint is molten. If the velocity is between 0.1 and 1 μm/s, then the particle travels between 3 and 30 μm, a distance that would not permit reinforcements to accumulate on either side of a 100 μm joint, with the former velocity being preferred. The dynamic viscosity, η, of the molten eutectic lead-tin solder of about 0.13 Pa sec at 280° C. is used as a representative for solder materials. Clough, R. B. et al., "Preparation and Properties of Reflowed Paste and Bulk Composite Solder," Proc. Technical Program Vol III, National Electronic Packaging and Production Conference, (Cahners Exhibition group, Des Plains, Ill. 1992), pp. 1256-65. The actual viscosity may be higher due to the presence of the particles. At an extreme, it can be assumed that the density of a particle is zero, as in a bubble, so $\Delta\rho$ is equal to $\rho$ and this becomes the highest conceivable value of $\Delta\rho$, and intermetallic particles will have a smaller value of $\Delta\rho$. Therefore, Stoke's law predicts that the larger the particle diameter, the greater the velocity. For example, for a 10 μm particle in the lowest viscosity condition with a density difference of 1 Mg/m³ (the difference in density between Sn (7.3) and $Cu_6Sn_5$ (8.3)), the velocity is near 0.5 μm/s, resulting in a travel distance of 15 μm in 30 seconds of molten time. Note that with smaller particles, the distance travelled will decrease with the square of the diameter, such that a 5 μm particle will travel only ¼ as far as the 10 μm particle. Such conditions make the melt-reflow of solder joints technically possible with a solid phase within the solder having a modest density difference and a reasonably short time for being molten.

In yet another embodiment, the intermetallic compound will comprise from about 5 to about 95 percent by volume (volume %) of the final composite solder. Preferably, the intermetallic phase will comprise from about 10 to about 40 percent by volume of the final composite solder. More preferably, the composite solder will comprise about 20 percent by volume of the intermetallic compound.

It will be appreciated that the composition of the intermetallic component may be determined using phase diagrams for the eutectic solders found in Material Science & Metallurgy references such as Smithell's Metals Reference Book, 7th ed., E. A. Brandes and G. B. Brook, eds., Butterworth & Heinemann, Oxford, 1992. For example, if a Sn/Ag eutectic solder and a Ni/Sn intermetallic phase are used, the intermetallic component that is the closest one to the tin, as determined from the phase diagram, is $Ni_3Sn_4$. If a volume fraction of the intermetallic phase of about 20% is desired in the composite solder, then the composite solder would comprise 100 g of the Sn/Ag composite solder and 20 g of the mixture of Sn and Ni that make the intermetallic. In this example, $Ni_3Sn_4$ contains about 72% Sn by weight so the 20 g mixture of Sn and Ni would comprise 14.4 g of Sn and 5.6 g of Ni. If the intermetallic phase is Nb/Sn, then the best intermetallic compound would be $NbSn_2$ which is also about 72% Sn. In yet another example, $FeSn_2$ is about 81% Sn by weight, so $FeSn_2$ particles could be made in-situ in the composite solder at 20 percent by volume by the addition of a mix of 81% Sn and 19% Fe by weight to a eutectic solder. Another example of an intermetallic phase that could be used with tin-based solders is $Cu_6Sn_5$ which contains 61% Sn and 39% Cu by weight. Any combination of metallic elements that provide a desirable intermetallic strengthening phase may thus be chosen by those skilled in the art, in accordance with the principles of the invention set forth herein.

In another embodiment of the methods of the present invention, the components of the intermetallic phase and the eutectic solder are added to an apparatus for processing. The apparatus, such as a container, must be able to withstand the required temperatures used to produce the in-situ composite solder, e.g., a covered graphite crucible would be suitable. The mixture is then heated to a temperature that is greater than the highest melting temperature of the individual components. For example, if the solder is Sn/Ag and the intermetallic phase is $Cu_6Sn_5$, the mixture is heated to a temperature above the melting temperature of pure Cu, which has the highest melting point, 1085° C., among the constituent materials. In one embodiment, the apparatus is an induction furnace with a reducing gas environment. The components of the composite solder are melted in an inert atmosphere, preferably argon or helium, to prevent oxidation of the component materials during melting. Once the desired temperature is reached, it is maintained for several minutes to ensure complete melting and mixing of all the constituent materials. The heating element is then turned off and the melt is solidified and slowly cooled to room temperature.

In yet another embodiment, the cooled solder is remelted to a temperature above the melting temperature of the intermetallic phase such that all reinforcing intermetallic particles dissolve in the molten solder. It will be appreciated that the remelt temperature may be determined using phase diagrams for metallic compounds found in Material Science & Metallurgy references such as Smithell's Metals Reference Book, 7th ed., E. A. Brandes and G. B. Brook, eds., Butterworth & Heinemann, Oxford, 1992. With the example of a Sn/Ag eutectic solder having an intermetallic phase of $Cu_6Sn_5$, the composite solder is remelted at a temperature of 676° C. The melt is then rapidly cooled and solidified to form a fine particulate intermetallic structure. Rapid cooling can be achieved by splat quenching, spray atomization, continuous casting into solid form, rapid solidification melt spinning or other rapid solidification processes known to those skilled in the art.

Splat quenching involves pouring the melted composite solder onto a copper plate, producing a circular splat of solder. A second copper plate can be placed on top of the solder to induce even more rapid cooling.

Spray atomization can also be employed for rapid cooling and solidification of the molten composite solder, producing powders from which paste solders can be made. For example, solder powder of the present invention can be produced as ultrafine rapidly solidified and generally spherical powder by high pressure gas atomization (HPGA).

Continuous casting can also be used to achieve rapid cooling. In one method of continuous casting, the molten composite solder can be processed between water-cooled rollers forming sheets of solder.

Rapid solidification melt spinning, where the molten composite solder is sprayed onto rotating, water-cooled cylinders forming ribbons of solid composite solder is yet another means of achieving rapid cooling.

It will be recognized by those skilled in the art that the steps of the methods of the present invention can be combined in a single operation with a properly designed apparatus. With the proper temperature control, the initial composite solder can be formed at the appropriate temperature, slowly cooled to a temperature just above the solidification temperature of the intermetallic phase, and then rapidly cooled to produce a solder with the desired properties.

The melting and rapid cooling of the composite solder results in an intermetallic phase comprising fine particles with a size preferably less than about 10 microns. More preferably the size of the intermetallic particles are less than about 5 microns. Most preferably the intermetallic particles have a size less than about 2 microns.

Figure 2A:
FIGS. 2A-2B are scanning electron photomicrographs showing the effect of the rate of cooling on the microstructure of the $Cu_6Sn_5$ intermetallic phase in an eutectic Sn/Ag composite solder.
Figure 2B:
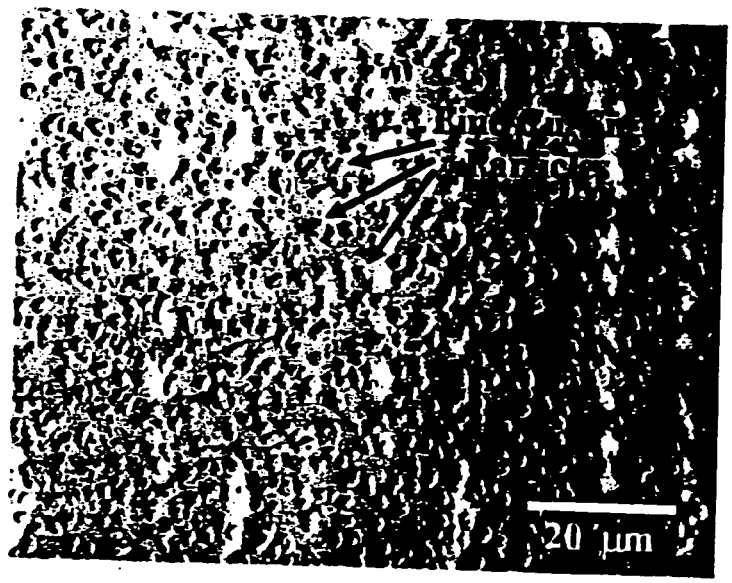
Figure 3C:
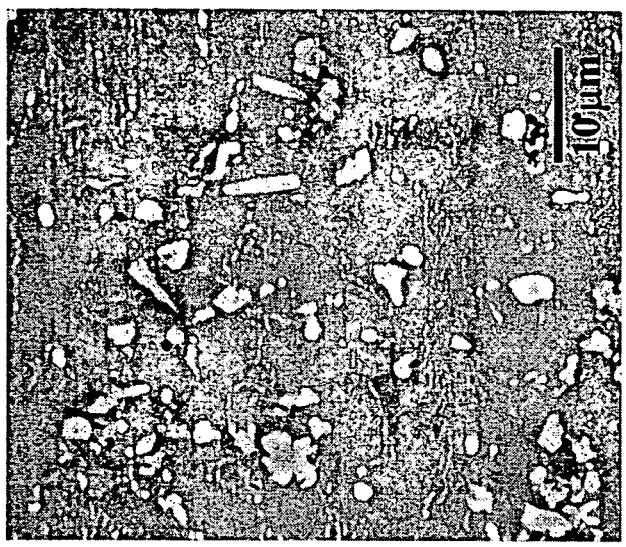
FIGS. 3A-3C are scanning electron photomicrographs detailing the microstructure of eutectic Sn/Ag composite solder joints.
Figure 3B:
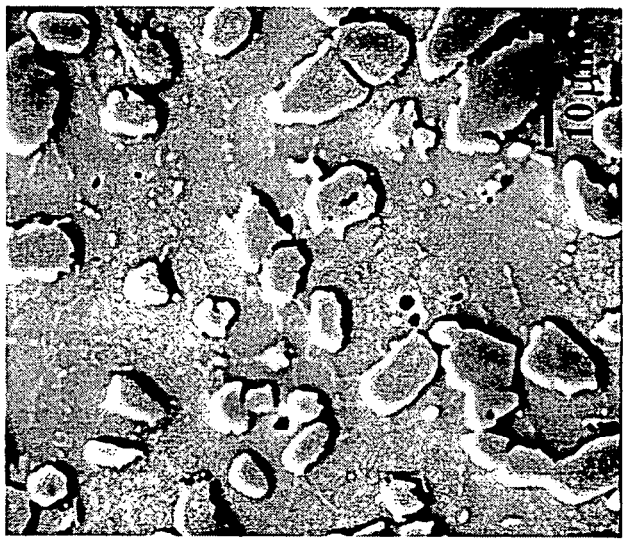
Figure 3A:

The micrographs shown in FIGS. 2A and 2B show the effect of cooling on the size of the intermetallic phase particles in an eutectic Sn/Ag composite solder with a $Cu_6Sn_5$ intermetallic phase. The optical microscopy images of the microstructure of the composite solder were recorded using an Olympus PM 3 microscope. The intermetallic microstructure of the slow-cooled eutectic composite solder exhibited 50-200 μm rod shaped $Cu_6Sn_5$ intermetallic phase particles surrounded by colonized eutectic Sn/Ag microstructure (FIG. 2A). The observed structures have a large intermetallic size significantly greater than 10 microns. In contrast, when the eutectic composite solder was rapidly cooled and solidified, the $Cu_6Sn_5$ intermetallic phase consisted of very fine particles with a size less than 2 microns distributed homogeneously throughout the eutectic Sn/Ag matrix (FIG. 2B). Similar results were obtained when a Sn/Pb (63 Sn/37 Pb) solder was used as the matrix with a $Cu_6Sn_5$ intermetallic phase. When this eutectic composite solder was used as preforms to make 1 mm×0.1 mm thick solder joints by methods known to those skilled in the art, the melt-reflowed solder joint retained the fine particle structure and homogeneous distribution of the $Cu_6Sn_5$ intermetallic phase (FIG. 3A). Similar results were observed when the intermetallic phases were $Ni_3Sn_4$ and $FeSn_2$ in a Sn/Ag composite solder (FIGS. 3B and 3C).

The solder produced by the methods of the invention can be provided in numerous forms as needed for any particular solder application. For example, the solder produced as described herein can be provided as solder wire, solder sheet, solder ingot, and solder powder. The solder wire and sheet forms can be manufactured by conventional solder manufacturing techniques. Solder powder can be formed by spray atomization techniques, e.g., as discussed herein, or by atomization processes including other high pressure, close-coupled atomization processes using inert gas or air atomizing gas and low pressure and free-fall gas atomization processes. Such ultrafine rapidly solidified, generally spherical powder, can be incorporated into electronic solder pastes for use in circuit assembly by means of surface mount technology.

The solder formed by the methods of the present invention can be used to form solder joints superior to those of eutectic solders alone and those with coarser intermetallic phases. The solder joint can be formed using methods known to those skilled in the art, appropriate for any particular application. The heating history employed is similar to common manufacturing practice wherein the temperature used to melt or soften the solder is about 50° C. above the melting point of the solder matrix. During this process, the solder matrix melts while the intermetallic reinforcements remain as solids. Upon cooling of the solder joint, the intermetallic particles remain evenly distributed. For example, two copper dogbone halves may be treated with a liquid flux containing 25-35 weight % zinc chloride, 2-7 weight % ammonium chloride, 1-5 weight % hydrochloric acid in a water base prior to forming the solder joint. It will be appreciated that any appropriate flux solution can be used to pretreat the surfaces to be joined. After preparation, a piece of eutectic Sn/Ag composite solder, preformed into 100 micron thick sheets, was sandwiched between the two pieces of copper. The assembly was then placed on a preheated hotplate and the temperature was allowed to reach 270° C. before being removed to cool. As observed in the photomicrographs in FIGS. 2A-2C, the intermetallic phase of the solder remains evenly distributed throughout the joint even though a small amount of coarsening has occurred. The intermetallic phases of the eutectic Sn/Ag composite solder were $Cu_6Sn_5$ (FIG. 3A), $Ni_3Sn_4$ (FIG. 3B), and $FeSn_2$ (FIG. 3C).

Figure 4:
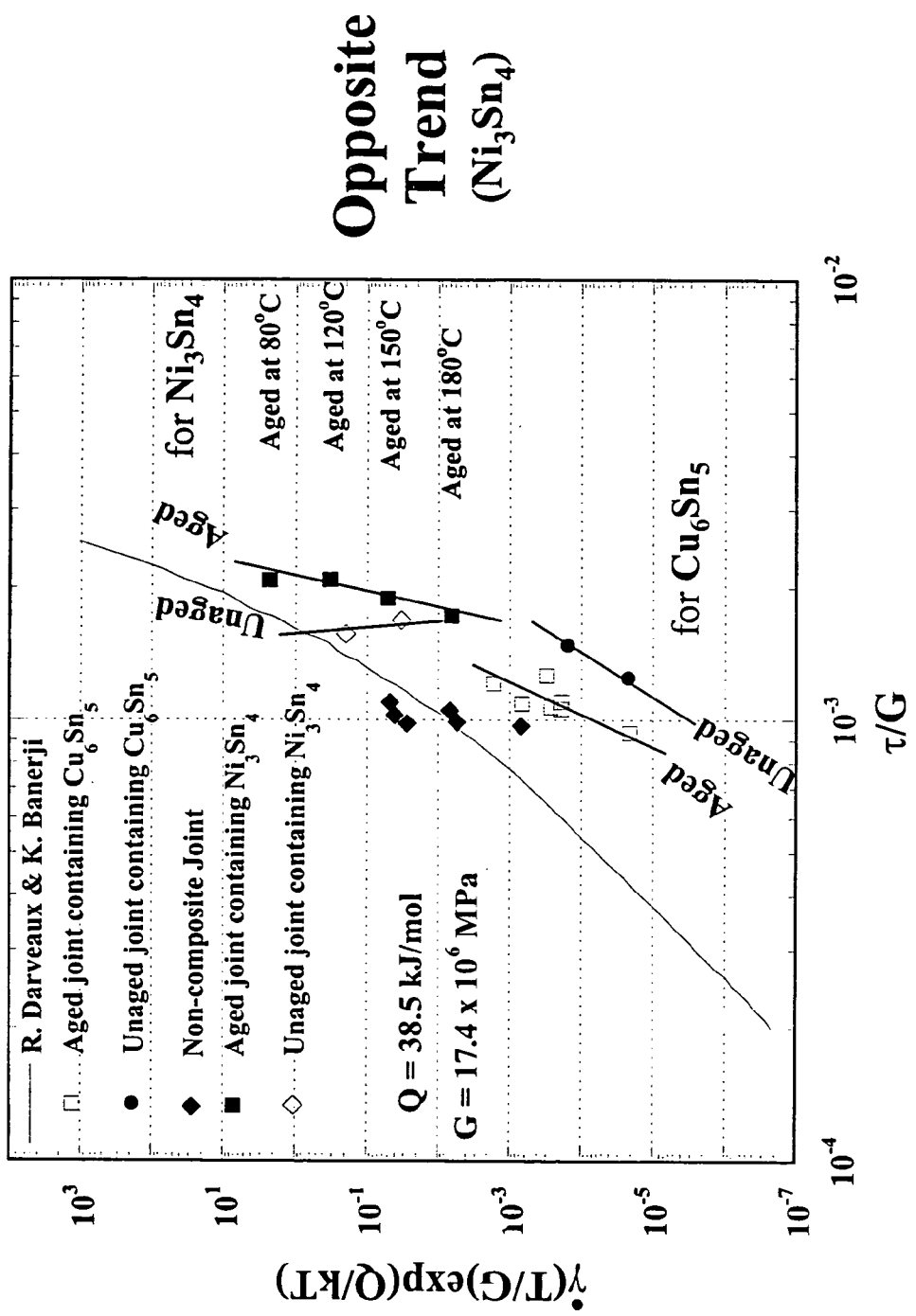
FIG. 4 is a graph comparing the creep strain-rate in eutectic Sn/Ag composite solder joints to non-composite Sn/Ag solder joints.

The solder formed by the methods of the present invention provide greater solder joint strength and creep resistance as compared to lead or lead-free eutectic non-composite solders. The creep behavior of both unaged and aged composite solder joints was improved by a factor of 100-1000 as a consequence of the composite phase of the solder formed by the methods of the present invention (FIG. 4). Although the creep resistance of aged joints was degraded, composite solders produced by the methods of the present invention still exhibit better creep behavior as compared to the corresponding non-composite eutectic solders (solid line, FIG. 4).

Figure 5:
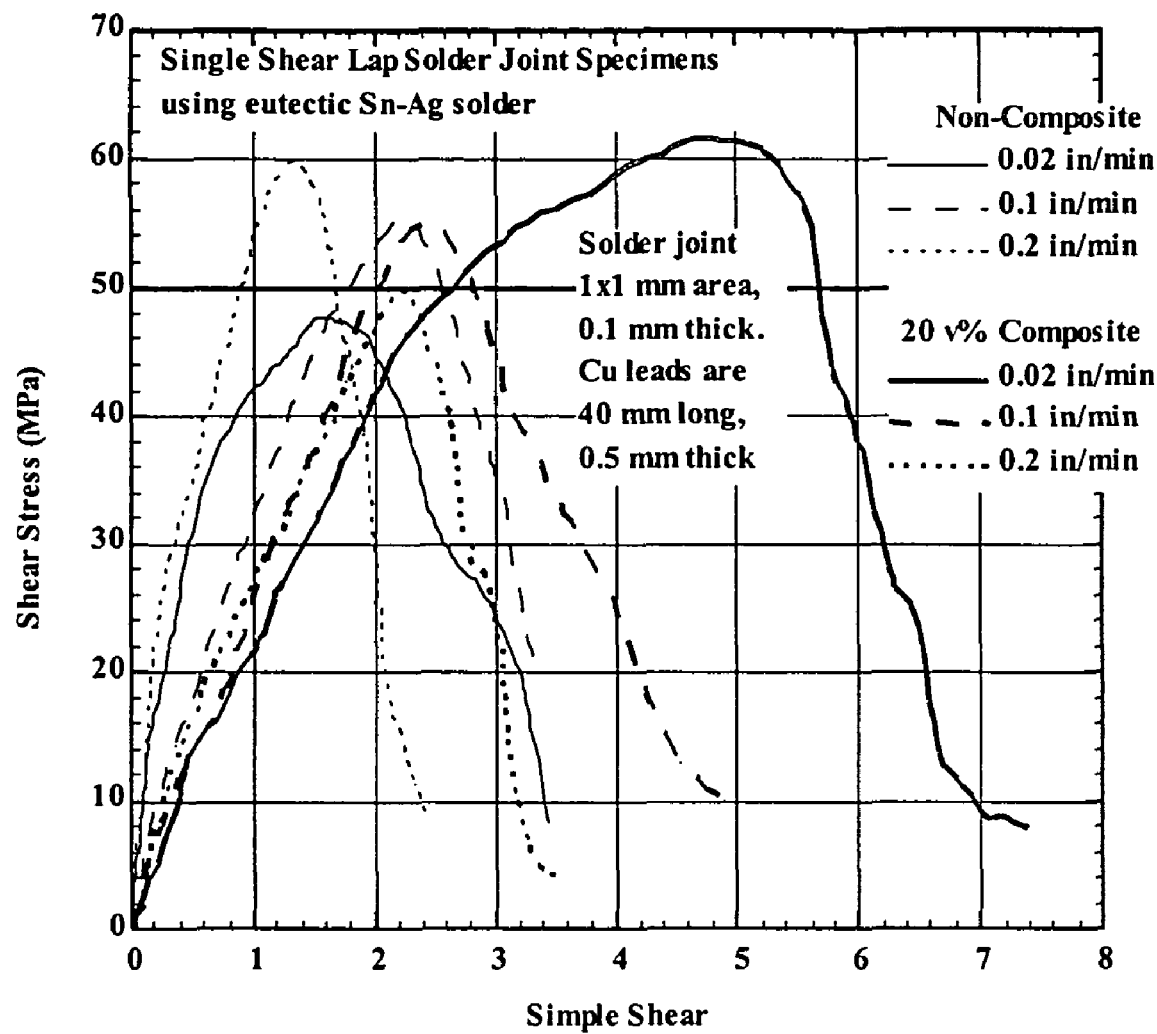
FIG. 5 is a graph illustrating the results of tensile tests of single lap shear specimens of composite and non-composite eutectic solders.

Tensile tests were conducted on single shear lap specimens to determine how the in-situ reinforcements affected the ductility and strength. The results presented in FIG. 5 show that the elongation was uniformly increased in the composite solder specimens as compared to non-composite solder specimens by as much as a factor of two. The rate of increase in stress with strain (work hardening) was lower for the composite solder as well. These two observations indicate that the strain is spread out more evenly throughout the solder joint in the composite specimen. This greater ductility indicates that under similar strain controlled fatigue conditions, more cumulative strain cycling can be tolerated in the composite solder as compared to the non-composite, which will increase the fatigue life. Also, the fact that the strain hardening rate is lower indicates that the stress imposed for a given shear strain in the composite is lower, which will put less stress on the board, components, and the solder, which will lead to less damage accumulation per cycle.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and the following claims.

All references and patents referred to herein are expressly incorporated by reference.

We claim:

1. A method for producing an in-situ composite solder having an intermetallic component, comprising the steps of:
    (a) providing a mixture comprising the components of a eutectic or near-eutectic matrix solder and the components of an intermetallic component present at greater than or equal to about 10 volume % and less than or equal to about 95 volume %, wherein said intermetallic component is selected to have a density within 10% of a density of said eutectic or near-eutectic matrix solder;
    (b) heating said mixture so as to melt all components of said mixture forming a non-solid mixture; and
    (c) cooling said non-solid mixture at a rate sufficiently fast so as to form said intermetallic components having a particle size of less than about 10 microns, wherein said intermetallic components are homogenously distributed throughout said matrix solder to form the composite solder.

2. A method of claim 1, wherein said intermetallic component comprises a transition metal.

3. A method of claim 2, wherein said intermetallic component comprises a first row transition metal.

4. A method of claim 3, wherein said intermetallic component comprises a metal selected from the group consisting of nickel, iron, copper, and mixtures thereof.

5. A method of claim 4, wherein said intermetallic component comprises $Cu_6Sn_5$.

6. A method of claim 4, wherein said intermetallic component comprises $Ni_3Sn_4$.

7. A method of claim 4, wherein said intermetallic component comprises $FeSn_2$.

8. A method of claim 2, wherein said intermetallic component comprises a metal which is a component of said matrix solder.

9. A method of claim 1, wherein said matrix solder is a lead-free eutectic or near-eutectic solder.

10. A method of claim 9, wherein said matrix solder is a binary or ternary solder.

11. A method of claim 10, wherein said matrix solder is 96.5 Sn/3.5 Ag.

12. A method according to claim 1, wherein said intermetallic components are less than 5 microns in size.

13. A method according to claim 12, wherein intermetallic components having a particle size of less than about 5 microns are homogenously distributed throughout said matrix solder.

14. A method according to claim 13, wherein intermetallic components having a particle size of less than about 2 microns are homogenously distributed throughout said matrix solder.

15. A method according to claim 1, wherein said intermetallic component comprises from about 10% to about 20% by volume of said composite solder.

16. A method of claim 15, wherein said intermetallic component comprises about 20% by volume of said composite solder.

17. A method according to claim 1, additionally comprising, after said heating step (b) and prior to said cooling step (c), the steps of cooling said mixture to form a solid, and remelting said solid at a temperature sufficient to melt all components of said solid.

18. A method according to claim 1, wherein said cooling is at a rate of at least about 100° C./second.

19. A method of claim 1, wherein said cooling step comprises cooling by spat quenching, spray atomization, or by continuous casting into a solid form.

20. A method for producing an in-situ composite solder having an intermetallic component, comprising the steps of:
   (a) providing a mixture comprising the components of a matrix solder and the components of said intermetallic component in amounts appropriate to form a solder having from about 10% to about 40% by volume of said intermetallic component, wherein said intermetallic component is selected to have a density within 10% of a density of said matrix solder;
   (b) heating said mixture so as to melt all components of said mixture forming a non-solid mixture; and
   (c) cooling said non-solid mixture at a rate sufficiently fast so as to form a composite solder wherein intermetallic components having a particle size of less than about 10 microns are homogenously distributed throughout said matrix solder.

21. A method of claim 20, wherein said intermetallic component comprises a first row transition metal.

22. A method of claim 21, wherein said intermetallic component comprises a metal selected from the group consisting of nickel, iron, copper, and mixtures thereof.

23. A method of claim 22, wherein said intermetallic component comprises a compound selected from the group consisting of $Cu_6Sn_5$, $Ni_3Sn_4$, $FeSn_2$, and mixtures thereof.

24. A method of claim 21, wherein said intermetallic component additionally comprises a metal which is a component of said matrix solder.

25. A method of claim 20, wherein said matrix solder is a eutectic or near-eutectic binary or ternary solder.

26. A method of claim 25, wherein said matrix solder is 96.5 Sn/3.5 Ag.

27. A method of claim 20, wherein said cooling step comprises cooling by spat quenching, spray atomization, or by continuous casting into a solid form.

28. A method according to claim 20, wherein said solder is lead-free.

29. A method according to claim 20, wherein said intermetallic components are less than 5 microns in size.

30. A method according to claim 29, wherein intermetallic components having a particle size of less than about 5 microns are homogenously distributed throughout said matrix solder.

31. A method according to claim 30, wherein intermetallic components having a particle size of less than about 2 microns are homogenously distributed throughout said matrix solder.

32. A method according to claim 20, wherein said intermetallic component comprises from about 10% to about 20% by volume of said composite solder.

33. A method according to claim 20, wherein said cooling is at a rate of at least about 100° C./second.

34. A method according to claim 20, additionally comprising, after said heating step (b) and prior to said cooling step (c), the steps of cooling said mixture to form a solid, and remelting said solid at a temperature sufficient to melt all components of said solid.

35. A method for producing an in-situ composite solder having an intermetallic component, comprising the steps of:
   (a) providing a binary or ternary eutectic or near eutectic matrix solder;
   (b) heating a mixture of said matrix solder with the components of an intermetallic component comprising a first row transition metal, at a temperature greater than the highest melting temperature of all of the individual components of said mixture so as to form a non-solid mixture;
   (c) rapidly cooling said non-solid mixture; wherein said composite solder comprises from about 10% to about 40% by volume of said intermetallic component, said intermetallic component comprises at least one element present in said matrix solder; said intermetallic component comprises particles having a particle size of less than about 10 microns homogenously distributed throughout said composite solder, and said intermetallic component is selected to have a density within 10% of a density of said matrix solder;
   (d) heating said composite solder to a temperature that is greater than a melting point of said matrix solder and less than a melting point of said intermetallic component, wherein said heating melts only said matrix solder; and
   (e) cooling and solidifying said composite solder to form a solder joint, wherein said composite solder has a greater solder joint strength, creep resistance, and fatigue resistance than a comparative solder joint formed from a eutectic or near-eutectic solder.

36. A method of claim 35, wherein said particle size is less than 5 microns.

37. A method of claim 35, wherein said particle size is less than 2 microns.

38. A method of claim 35, wherein said intermetallic component comprises a metal selected from the group consisting of nickel, iron, copper, and mixtures thereof.

39. A method of claim 38, wherein said intermetallic component comprises a compound selected from the group consisting of $Cu_6Sn_5$, $Ni_3Sn_4$, $FeSn_2$, and mixtures thereof.

40. A method of claim 39, wherein said matrix solder is 96.5 Sn/3.5 Ag.

41. A method of claim 35, wherein said intermetallic particles comprises about 10% to about 20% by volume of said composite solder.

42. A method of claim 35, wherein said cooling step comprises cooling by splat quenching, spray atomization, or by continuous casting into a sold form.

43. A method according to claim 35, additionally comprising, after said heating step (b) and prior to said cooling step (c), the steps of cooling said mixture to form a solid, and remelting said solid at a temperature sufficient to melt all components of said solid.

* * * * *